(12) United States Patent
Koide et al.

(10) Patent No.: US 7,113,416 B2
(45) Date of Patent: Sep. 26, 2006

(54) ASSOCIATIVE MEMORY APPARATUS FOR SEARCHING DATA IN WHICH MANHATTAN DISTANCE IS MINIMUM

(75) Inventors: Tetsushi Koide, Higashihiroshima (JP); Hans Jurgen Mattausch, Higashihiroshima (JP); Yuji Yano, Higashihiroshima (JP)

(73) Assignee: Hiroshima University, Higashihiroshima (JP)

( * ) Notice: Subject to any disclaimer, the term of this patent is extended or adjusted under 35 U.S.C. 154(b) by 22 days.

(21) Appl. No.: 10/915,430

(22) Filed: Aug. 11, 2004

(65) Prior Publication Data

US 2005/0162878 A1 Jul. 28, 2005

(30) Foreign Application Priority Data

Jan. 26, 2004 (JP) ............................. 2004-017429

(51) Int. Cl.
*G11C 7/00* (2006.01)
(52) U.S. Cl. .................................... 365/49; 365/189.07
(58) Field of Classification Search ................. 365/49, 365/189.07, 154
See application file for complete search history.

(56) References Cited

U.S. PATENT DOCUMENTS 6,415,293 B1* 7/2002 Navoni et al. ............... 707/100

OTHER PUBLICATIONS

Compact associative memory architecture with fully parallel search capability for the minimum Hamming distance. IEEE, vol. 37, No. 2, Feb. 2002.*

An architecture for compact associative memories with Deca-ns nearest match capability up to large distances. IEEE 2001 International solid state circuits conference, First edition, Feb. 2001.*

Fully parallel pattern matching engine with dynamic adaptability to Hamming or Manhattan distance. 2002 Symposium on VLSI circuits, IEEE Cat. No. 02CH37302.*

Takahiro Hanyu et al., Multiple-Valued Logic-in-Memory VLSI Architecture Based on Floating-Gate-MOS Pass-Transistor Logic, IEICE Trans. Electron, vol. E82-C, No. 9, Sep. 1999, pp. 1662-1668.

* cited by examiner

*Primary Examiner*—Vu A. Le
(74) *Attorney, Agent, or Firm*—Oblon, Spivak, McClelland, Maier & Neustadt, P.C.

(57) ABSTRACT

In the present invention, focusing on the point that the number of transistors can be reduced to about ⅔ of that in a prior art due to an absolute-value-of-difference calculating circuit for an associative memory being configured of an addition circuit and a bit inversion circuit. The absolute-value-of-difference calculating circuit is built in a fully-parallel type associative memory as a unit comparison circuit, and all of the outputs of the absolute-value-of-difference calculating circuits for which the number of comparisons thereof are prepared are input to weight comparison circuits, whereby the calculation of the Manhattan distance between the search data and the reference data is carried out. In accordance with the configuration, because a Manhattan distance calculating circuit can be realized by a fewer number of transistors and with a small area, an associative memory apparatus as well can be realized at a low power consumption and with a small area.

4 Claims, 9 Drawing Sheets

FIG. 4A Formula
$$|SW-REF_i| = \begin{cases} \overline{SW+\overline{REF_i}}+1 & (SW > REF_i) \\ \overline{\overline{SW+\overline{REF_i}}} & (SW \leq REF_i) \end{cases}$$
FIG. 4B Conventional circuit configuration (entire body) using adders and selector
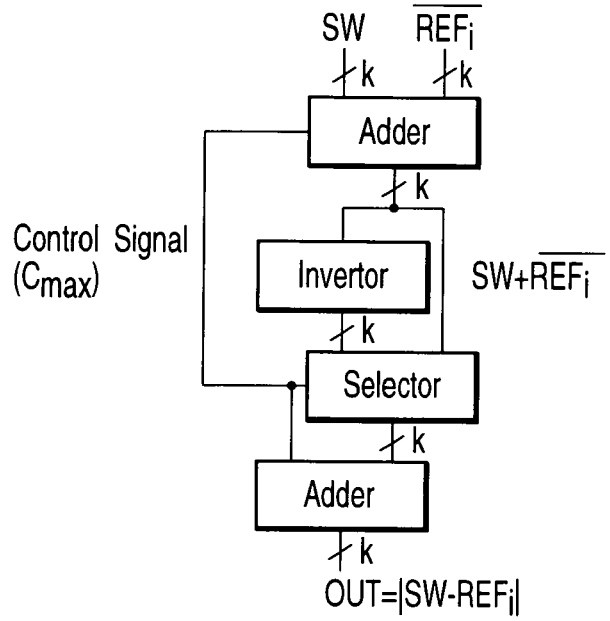
FIG. 4C Conventional circuit configuration (k-bit) using adders and selectors
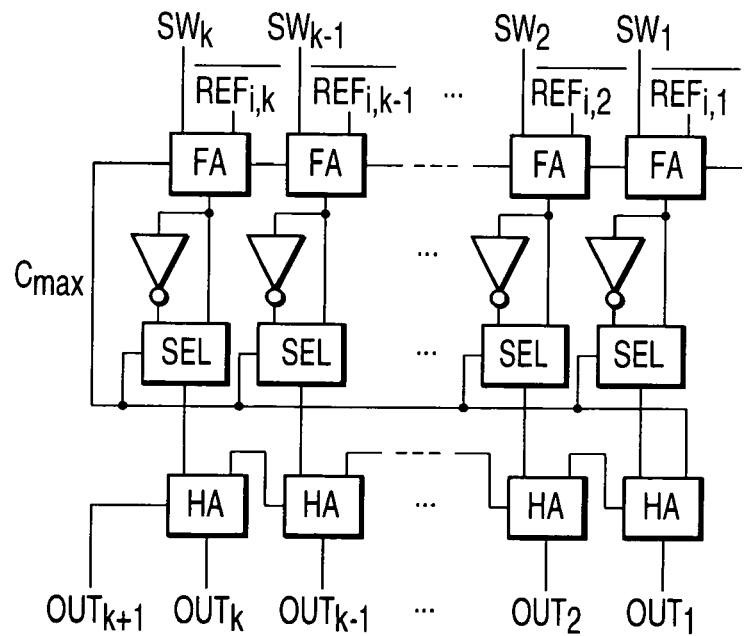
$30*(k-1)+12*(k+1)+2*k+6*k=50k-18$ (Number of transistors)

Calculation of D = |SW−REF|

Subtraction can be expressed by addition using 2's complement (1) In case of SW>REF
 $|SW-REF| = (SW+\overline{(REF)})+1$
 (ex.) $|0111-0001| = (0111+(1110))+0001 = (10101)+0001 \rightarrow 0110$ (2) In case of SW≦REF
 $|SW-REF| = \overline{(SW+\overline{(REF)})}$
 (ex.) $|0011-0111|+\overline{(0011+1000)} = \overline{01011} \rightarrow 0100$ ⇒ When carry ($C_{max}$) of most significant bit (MSB) of the calculated result of $SW + \overline{(REF)}$ is 0, the result is inverted, and when it is 1, 1 is added to the result Calculation of absolute value of difference

FIG. 6A

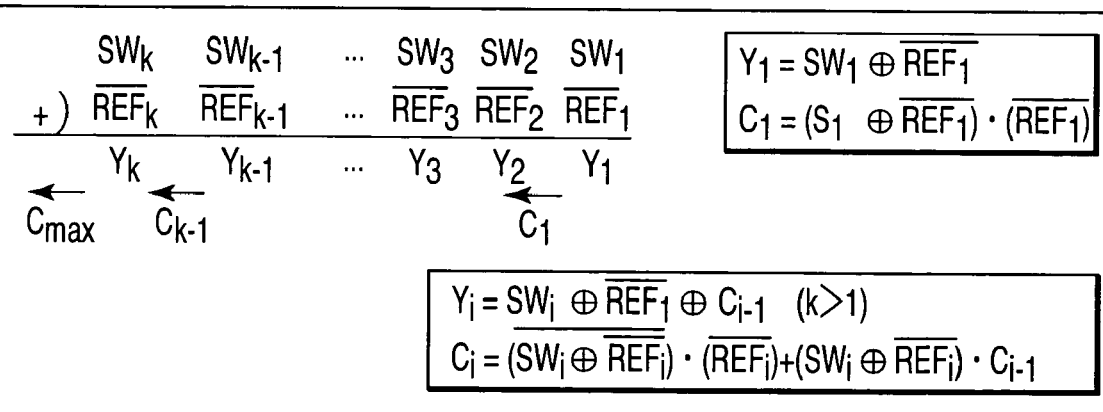

Addition $(Y = SW + \overline{REF})$

FIG. 6B

ASSOCIATIVE MEMORY APPARATUS FOR SEARCHING DATA IN WHICH MANHATTAN DISTANCE IS MINIMUM

CROSS-REFERENCE TO RELATED APPLICATIONS

This application is based upon and claims the benefit of priority from prior Japanese Patent Application No. 2004-017429, filed Jan. 26, 2004, the entire contents of which are incorporated herein by reference.

BACKGROUND OF THE INVENTION

1. Field of the Invention

The present invention relates to an associative-memory apparatus which is used for an apparatus for information processing such as color or gray scale image compression and image recognition, and which has a function of searching for data in which the Manhattan distance is a minimum by fully-parallel processing.

2. Description of the Related Art

In recent years, in the field of information processing, in particular, of image compression and image recognition, an associative memory apparatus having a function of searching for minimum distance data has been given attention. The associative memory apparatus is one of the typical memories having a function of searching for data most similar (closest) to input information data (search data) from among a plurality of reference data registered in advance. Then, due to the excellent searching function, the associative memory apparatus is expected, when the associative memory apparatus is used for an application requiring a pattern matching function such as image compression and image recognition described above, to be able to greatly improve the performance of the pattern matching.

Here, the distance means a degree of inconsistency when search data and reference data are compared with one another, and it has been known that there are mainly the Hamming distance and the Manhattan distance. Given that the search data is SW={SW$_1$, SW$_2$, . . . , SW$_W$}, and the reference data stored in i row of the memory is REF$_i$={REF$_{i1}$, REF$_{i2}$, . . . , REF$_{iW}$}, the Hamming distance between the ith reference data and the search data is expressed by:

$$D_{Hamm,i} = \sum_{j=1}^{W} SW_j + REF_{ij} \quad (1)$$

The Manhattan distance follows:

$$D_{Manh,i} = \sum_{j=1}^{W} |SW_j - REF_{ij}| \quad (2)$$

The Hamming distance $D_{Hamm}$ is mainly used for recognizing data sequences, sound, characters, and the like, and the Manhattan distance $D_{Manh}$ is used for color or gray scale image compression/image recognition. As the fully-parallel type associative memory apparatuses which have been developed until now, a distance calculating circuit for searching for the a Hamming distance has been realized (refer to Document 1). However, there is no fully-parallel type associative memory apparatus in which a function of searching for the Manhattan distance needed for color or gray scale image compression/image recognition, or the like is realized at the memory region of the associative memory.

On the other hand, a system in which the Manhattan distance is encoded by using an associative memory for searching for the Hamming distance has been proposed (refer to Document 2). However, in this system, the circuit area is rapidly made large when the number of bits of each pattern is greater than or equal to 4 bits, and there is the problem that the electric power consumption increases accompanying with an increase in the circuit area. Further, in order to realize a Manhattan distance calculating circuit, it suffices that a circuit of calculating the absolute value of difference between the search data and the reference data is realized. However, in the case of using a subtracter (an adder) or an absolute value calculating circuit which have been conventionally known, there is the defect that the circuit scale (the number of transistors) become large.

[Document 1] H. J. Mattausch et al., "Compact associative-memory architecture with fully-parallel search capability for the minimum Hamming distance", IEEE Journal. of Solid-State Circuits, Vol. 37, pp. 218–227, 2002.

[Document 2] H. J. Mattausch et al., "Fully-parallel pattern-matching engine with dynamic adaptability to Hamming or Manhattan distance", 2002 Symposium on VLSI Circuit Dig. of Tech. Papers, pp. 252–255, 2002.

[Document 3] H. J. Mattausch et al., "An architecture for compact associative memories with deca-ns nearest-match capability up to large distance", ISSCC Dig. of Tech. Papers. pp. 170–171.

[Document 4] Jpn. Pat. Appln. KOKAI Publication No. 2002-288985

[Document 5] Jpn. Pat. Appln. KOKAI Publication No. 2004-005825

[Document 6] Jpn. Pat. Appln. KOKAI Publication No. 2004-013504

BRIEF SUMMARY OF THE INVENTION

An object of the present invention is to provide an associative memory apparatus which can realize a search for the Manhattan distance needed for color or gray scale image compression/image recognition at high speed and with a small area circuit by fully-parallel processing, and which is for searching for data in which the Manhattan distance is a minimum.

According to the present invention, there is provided an associative memory apparatus for searching reference data REF most similar to search data SW which is input with the same unit structure, from among W×R (W and R are arbitrary natural numbers) of reference data REF which are registered in advance in a memory region and which are respectively made to be units in k-bit (k1) units, on the basis of an index of a Manhattan distance, the apparatus comprising:

a distance calculating circuit which is formed at the memory region, and which calculates an absolute value of difference ISW-REFI in parallel with the W×R of reference data REF with respect to the search data SW, and outputs a degree D of an inconsistency between both data of the calculated results as a "Manhattan distance"; and a searching circuit which is formed at the memory region, and which searches reference data in which the calculated result of the Manhattan distance is made to be a minimum distance, wherein the distance calculating circuit comprises W columns×R rows of unit storage circuits to store the reference data in unit, W columns×R rows of unit comparison circuits which calculate a Manhattan distance between the reference data and the search data for each unit, and R columns of word weight comparison circuits which generate an electric current signal or a voltage signal corresponding to a Manhattan distance calculated at the W columns of unit comparison circuits for each rows, and the unit comparison circuit compares magnitudes of the reference data REF and the search data SW, and when the compared result thereof is SW>REF, (SW+(~REF))+1 (~ denotes inversion (complement 1's): hereinafter referred to as it) is calculated, and when the compared result thereof is SW≦REF, ~(SW+(~REF)) is calculated.

In accordance with the present invention, a reduction in a circuit scale and accelerating of calculating processing can be realized because all of the calculations of the absolute value of difference in the calculation of a Manhattan distance are realized by addition processing on the basis of a complement 2's, and a circuit configuration is scaled down due to it being determined whether an output signal is inverted by a carrying signal of the least significant bit, or 1 is added to the sum total of the outputs, by using dual signals (non-inversion signal and inversion signal) of a bit line of the search data existing at a unit storage circuit. As a result, by applying the present invention to the associative memory apparatus, a search of a minimum Manhattan distance can be realized with a chip configuration at a low electric power consumption and with a small area.

In this way, in the present invention, in a fully-parallel associative memory base system, a Manhattan distance calculating circuit needed for color and gray scale image compression/image recognition, or the like, is developed, and a minimum Manhattan distance searching associative memory apparatus at a low electric power consumption and with a small area is realized. In particular, the circuit configuration can make a highly efficient fully-parallel associative memory apparatus be a chip by using a conventional CMOS technology with respect to a pattern matching application (for example, a network router, code book base data compression, and object recognition).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A, 4B, and 4C each are diagrams illustrating the mechanism and configuration of a conventional Manhattan distance calculating circuit using adders and selectors.

FIGS. 6A and 6B each are diagrams for explaining a method for calculating the absolute value of difference according to the invention.

DETAILED DESCRIPTION OF THE INVENTION

Hereinafter, best modes for carrying out the present invention will be described in detail with reference to the drawings.

[Fully-Parallel Type Associative Memory Architecture]

Figure 1:
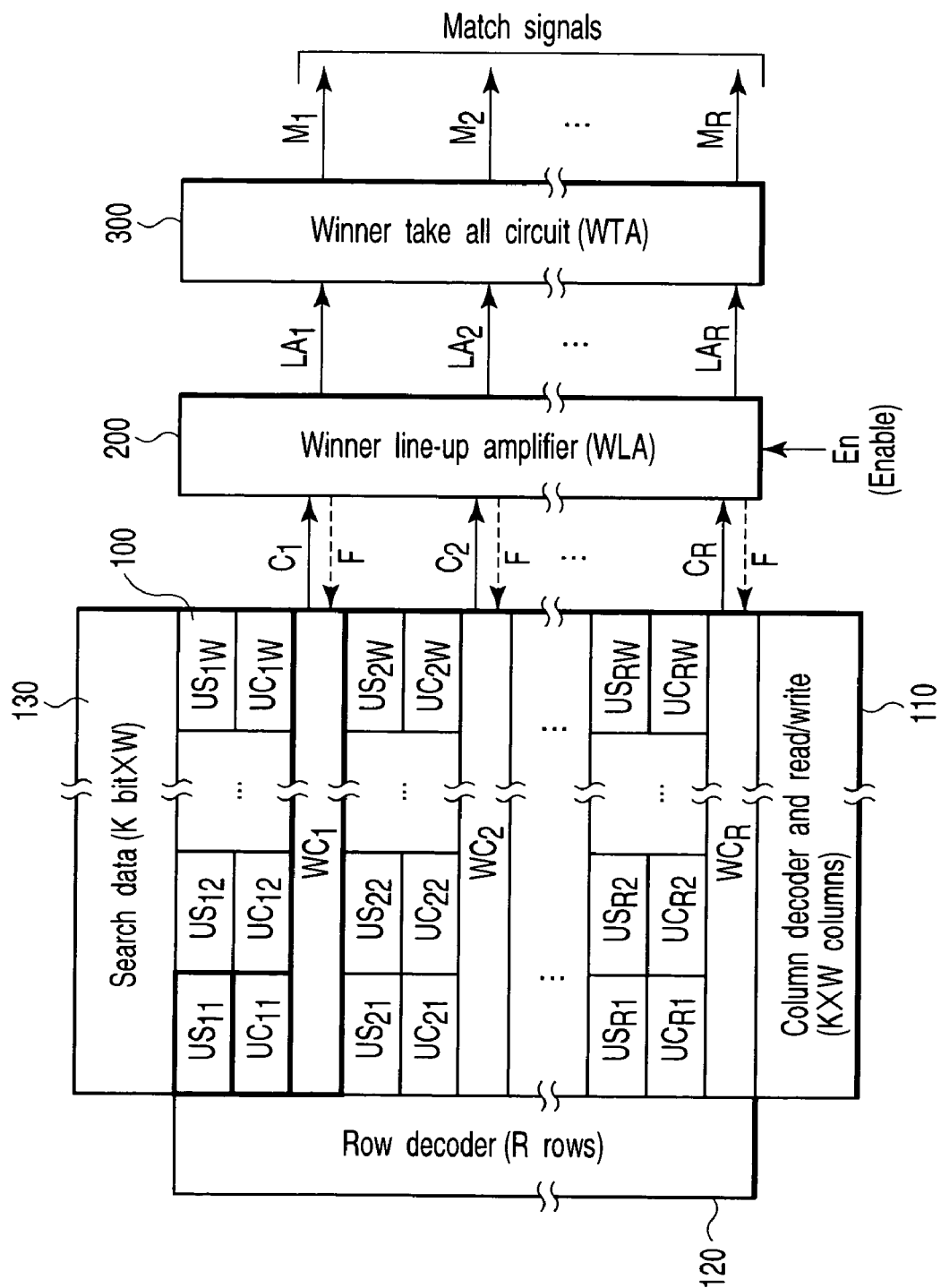
FIG. 1 is a block diagram illustrating an architecture of a fully-parallel type associative memory apparatus using a Manhattan distance calculating circuit as an embodiment according to the present invention.

FIG. 1 is a block diagram illustrating an architecture of a fully-parallel type associative memory apparatus using a Manhattan distance calculating circuit according to the present invention (refer to Document 1 or 4). A memory core portion is configured of a memory region (the left part) 100, a winner line-up amplification circuit (hereinafter, winner line-up amplifier [WLA] circuit) 200, and a total winner take all circuit (hereinafter, winner take-all [WTA] circuit) 300, and has a column decoder and R/W circuit (K×W Columns) 110, a row decoder (R Rows) 120, and a search data storage circuit (search data (K bits×W)) 130.

The memory region 100 is configured of W×R of unit storage circuits (unit storage: US) formed from SRAM cells for storing reference data in units (k bits), W×R of unit comparison circuits (unit comparison: UC) for calculating an absolute value of a difference between the reference data and the search data, i.e., a Manhattan distance, for each unit, and R of word weight comparison circuits (word comparison: WC) for converting the calculated distance into an analog voltage (or electric current).

A signal C (comparison signal) generated at the word weight comparison circuit WC enters the WLA circuit 200, and the WLA circuit 200 controls the signal C with the balance of the circuit itself, and amplifies the differences of the voltages between the respective rows to the maximums at the first stage. The WLA circuit 200 and the WTA circuit 300 have the feature that a ratio of an increase in areas with respect to the number of rows R becomes a linear O(R) with respect to the number of rows R.

The WTA circuit 300 has a function of further amplifying the differences between voltage outputs LA of the respective rows amplified by the WLA circuit 200. With respect to the output M of the WTA circuit 300, a winner row is "1" digital signal, and the other loser rows are "0" digital signals. The WLA circuit 200 accelerates feedback by using a voltage follower circuit built in the WLA circuit 200 at the time of returning a feedback signal F to the word weight comparison circuit WC.

[Manhattan Distance Calculating Circuit]

The Manhattan distance calculating circuit used for the associative memory apparatus of the present invention is a circuit in which W of units corresponding to k bits (k>1) that data to be dealt with are encoded are arranged as shown in FIG. 1. Given that the search data which will be an input of the associative memory apparatus and the reference data (i row) stored in the associative memory apparatus are respectively SW and $REF_i$, a Manhattan distance between SW and $REF_i$ is expressed as the following formula.

$$D_{Manh,i} = \sum_{j=1}^{W} |SW_j - REF_{ij}| \quad (3)$$

A Manhattan distance is used for image data processing by which comparison between the k-bit W of data such as a color image, a gray scale image, and the like is required. In order to realize the calculation of a Manhattan distance, there is required a circuit for carrying out a comparison between the weighted search data (SW) and the reference data (REFi), i.e., a circuit (absolute-value-of-difference calculating circuit $|SW_i-REF_{ij}|$) which generates absolute values of the differences between two k-bit data of W of the respective units.

Figure 2:
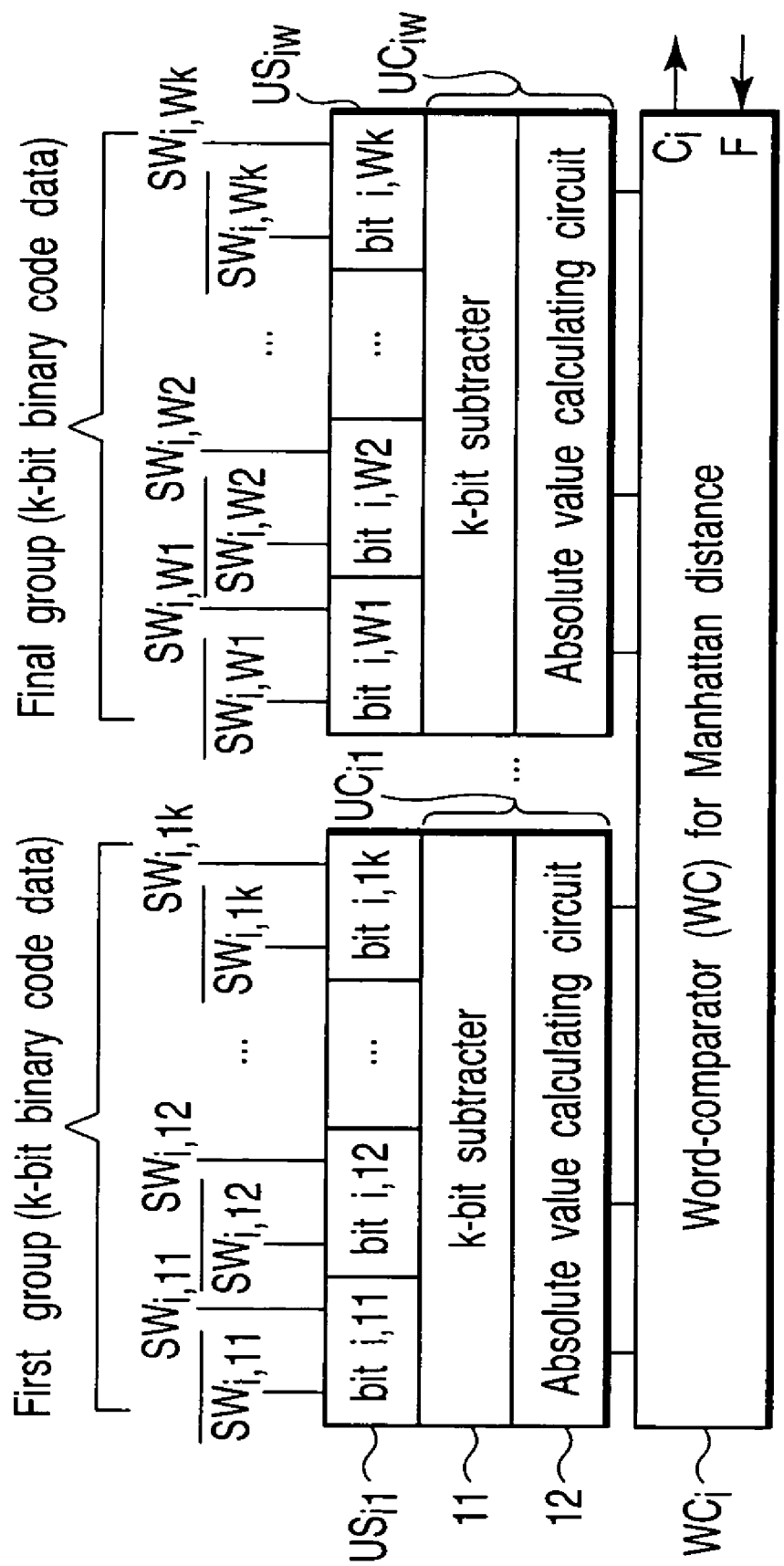
FIG. 2 is a block diagram illustrating a configuration of one row of the Manhattan distance calculating circuit in the memory shown in FIG. 1.

FIG. 2 is a block diagram (W units) illustrating a configuration, which is assembled in the associative memory apparatus, of the Manhattan distance calculating circuit with respect to the row i. In FIG. 2, $US_{i1}$ to $US_{iw}$ are respectively unit storage circuits which fetch search data units in accordance with k-bit binary code data of non-inversion signals SW and inversion signals ~SW (~ denotes inversion: hereinafter referred to as it), and which store the search data units along with the reference data unit stored in advance in bit units, and $UC_{i1}$ to $UC_{iw}$ are respectively unit comparison circuits having a k-bit subtracter 11 and an absolute value calculating circuit 12, the unit comparison circuits receiving the search data SW and the reference data REF from the unit storage circuits $US_{i1}$ to $US_{iw}$, and calculating an absolute value of the difference between the both. The data of the absolute values of the differences between the search data SW and the reference data REF calculated at the respective unit comparison circuits $UC_{i1}$ to $UC_{iw}$ are transmitted as the digital values of the output of the respective bits OUT={0,1} to the word weight comparison circuit $WC_i$, and the sum total of the Manhattan distances of all the bits is calculated at the word weight comparison circuit $WC_i$.

Figure 3:
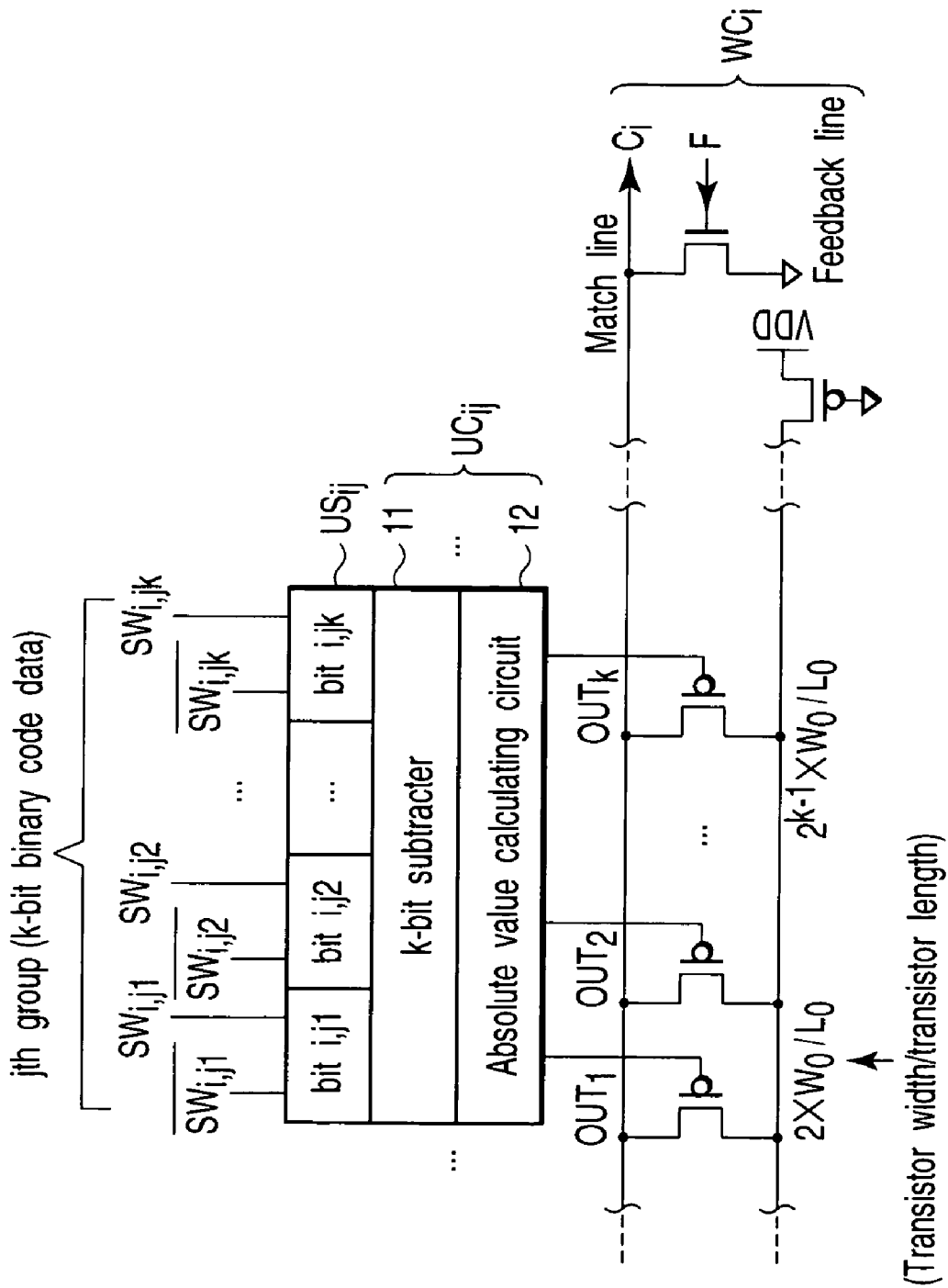
FIG. 3 is a block diagram illustrating a configuration of a word weight comparison circuit for a Manhattan distance shown in FIG. 2.

FIG. 3 shows an example of a circuit, that one group shown in FIG. 2 (jth group in FIG. 3) is sampled out, at which a calculated result of the Manhattan distance is converted into an electric current value in consideration of the weight of each bit at the word weight comparison circuit $WC_i$. In this example, weighting is carried out by adjusting output values $OUT_1, OUT_2, \ldots, OUT_k$ of the respective bits so as to be $2^{k-1}$ times electric current value of the $OUT_1$ which is the least significant bit, in accordance with the positions of the respective bits. As the adjusting method, weightings for the respective bits are carried out by controlling an value of electric current made to flow in a transistor connected to a match line in such a manner that a gate width $W_k$ of a transistor connected to the output $OUT_k$ of each bit is multiplied by an integer ($2^{k-1} \times W_0$) ($W_0$ denotes a transistor width serving as a reference). Electric current corresponding to the absolute value of the differences outputted from all of the unit comparison circuits $UC_{i1}$ to $UC_{iw}$ is made to flow in the match line, and in accordance therewith, electric current corresponding to a Manhattan distance between the search data $SW_i$ and the reference data $REF_{ij}$ of each group is made to flow, so that an electric current value i corresponding to a Manhattan distance $D_{manh}$ between the total search data SW and the reference data REF can be obtained. The electric current value i is converted into a voltage value and transmitted to the WLA circuit 200 and the WTA circuit 300, a signal at a row at which a Manhattan distance is made to be a minimum (called a winner column) is amplified, and "1" is output from the winner row at which the distance is the minimum.

Figure 5A:
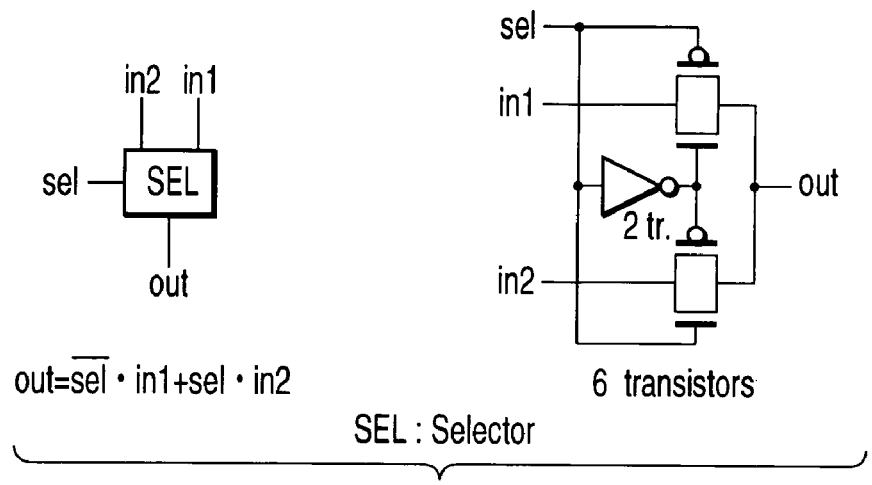
FIGS. 5A, 5B, and 5C each are diagrams illustrating respective components of the conventional Manhattan distance calculating circuit using adders and selectors.
Figure 5B:
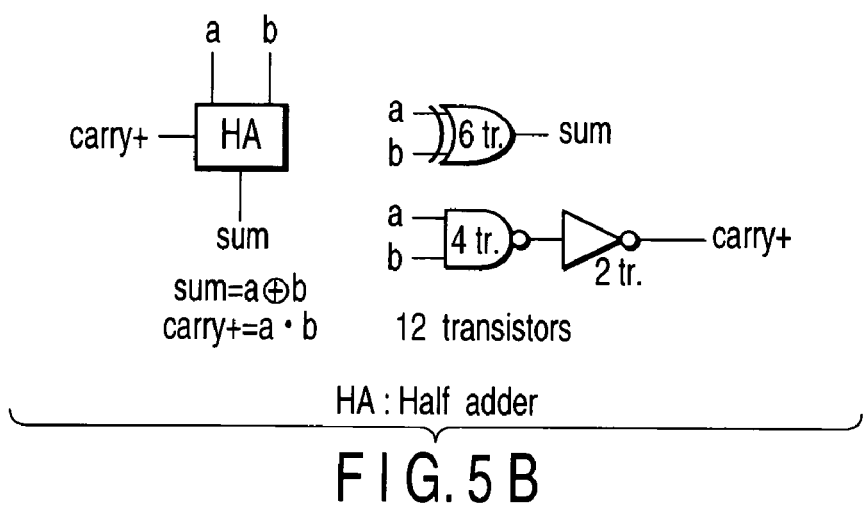
Figure 5C:
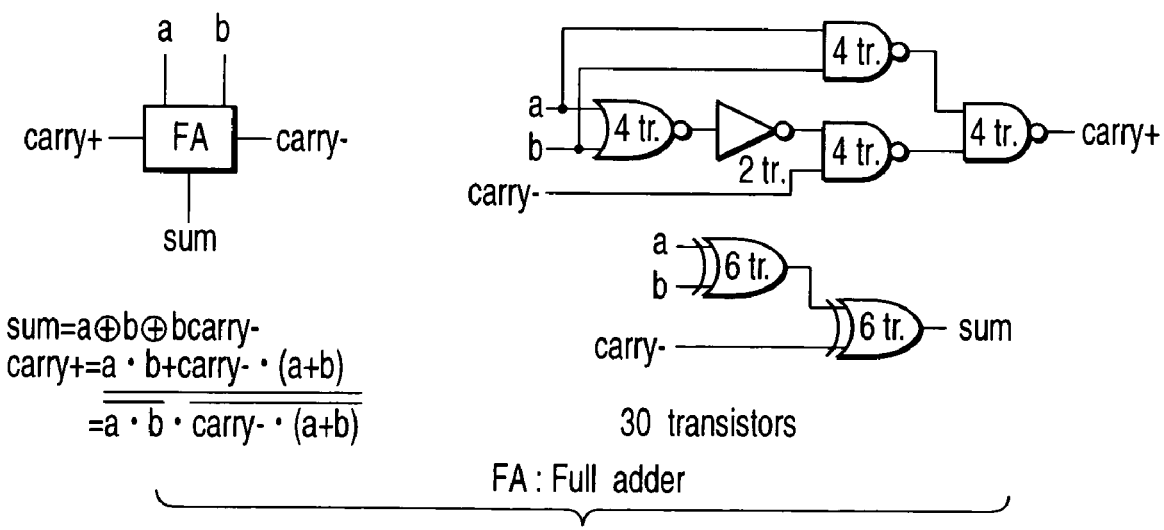

Generally, the k-bit subtracter 11 and the absolute value calculating circuit 12 shown in FIG. 2 can be configured by using an adder, a selector, and an inverter which have been conventionally known. For example, with respect to the formula shown in FIG. 4A due to the subtraction and the absolute value, the entire configuration of the unit comparison circuit UC using adders, a selector, and an inverter is as that shown in FIG. 4B, and the respective k-bit circuit configurations are as shown those in FIG. 4C. However, in this case, a selector SEL requires about six transistors as shown in FIG. 5A, a half adder HA requires about twelve transistors as shown in FIG. 5B, and a full adder FA requires about thirty transistors as shown in FIG. 5C. Therefore, the number of transistors for the entire absolute-value-of-difference calculating circuit follows:

30×(k−1)+12×(k+1)+2×k+6×k=50k−18 (number of transistors)     (4), and the number of transistors is many, and calculation of sign bits is required.

Then, in the present invention, a circuit in which the number of transistors is not many and the calculation of the absolute value of difference (Manhattan distance calculation) is carried out is provided for an associative memory. Further, this absolute-value-of-difference calculating circuit is built into the fully-parallel type associative memory as an unit comparison circuit UC, and all of the outputs of W of the absolute-value-of-difference calculating circuit are inputted to the word weight comparison circuit WC and processed thereat, whereby the calculation of a Manhattan distance between the search data and the reference data is realized.

The absolute-value-of-difference calculating circuit of the present invention is basically formed from two of the addition circuit and the bit inversion circuit. FIG. 6A is a diagram showing a method for calculating the absolute value of difference in the present invention, and FIG. 6B is a diagram showing a situation of the addition used for the calculation of the above-described absolute value of difference. Generally, in order to find the absolute value of difference between the two data SW and REF, a subtraction can be processed due to an addition by using a complement of 2. As shown in FIG. 6A, if the two cases of SW>REF and SW≦REF are calculated, when the carrying of the MSB (most significant bit) of the calculated result of SW+~REF (~denotes inversion (a complement 1's: hereinafter referred to as it) is finally 0, it suffices that the calculated result of SW+~REF is inverted, and when it is 1, it suffices that 1 is added to the calculated result of SW+~REF.

A truth table of the subtraction circuit (addition circuit) used in the absolute-value-of-difference calculating circuit is shown in Table 1.

TABLE 1

Table of truth value of addition circuit

| $C_{i-1}$ | $SW_i$ | $\overline{REF_i}$ | $\overline{(SW_i \oplus \overline{REF_i})} \cdot (\overline{REF_i})$ | $(SW_i \oplus \overline{REF_i}) \cdot C_{i-1}$ | $Y_i$ | $C_i$ |
|---|---|---|---|---|---|---|
| 0 | 0 | 0 | 0 | 0 | 0 | 0 |
| 0 | 0 | 1 | 0 | 0 | 1 | 0 |
| 0 | 1 | 0 | 0 | 0 | 1 | 0 |
| 0 | 1 | 1 | 1 | 0 | 0 | 1 |
| 1 | 0 | 0 | 0 | 0 | 1 | 0 |
| 1 | 0 | 1 | 0 | 1 | 0 | 1 |
| 1 | 1 | 0 | 0 | 1 | 0 | 1 |
| 1 | 1 | 1 | 1 | 0 | 1 | 1 |

$Y_i = SW \oplus \overline{REF_i} \cdot C_{i-1}$ ($k > 1$)
$C_i = \overline{(SW_i \oplus \overline{REF_i})} \cdot (\overline{REF_i}) + (SW_i \oplus \overline{REF_i}) \cdot C_{i-1}$ On the other hand, in the associative memory apparatus, the SRAM cell of the unit storage circuit US is operated by dual signals (non-inversion signal SW and inversion signal ~SW) of the bit line. Therefore, in the present invention, on the basis of the calculating method of FIG. 6A and Table 1, the circuit configuration is scaled down by determining whether the output signal is inverted by the carrying signal of the most significant bit, or 1 is added to the sum total of the outputs, by using the dual signals (non-inversion signal SW and inversion signal ~SW) of the bit line which exist at the SRAM cell of the unit storage circuit US.

Figure 7:
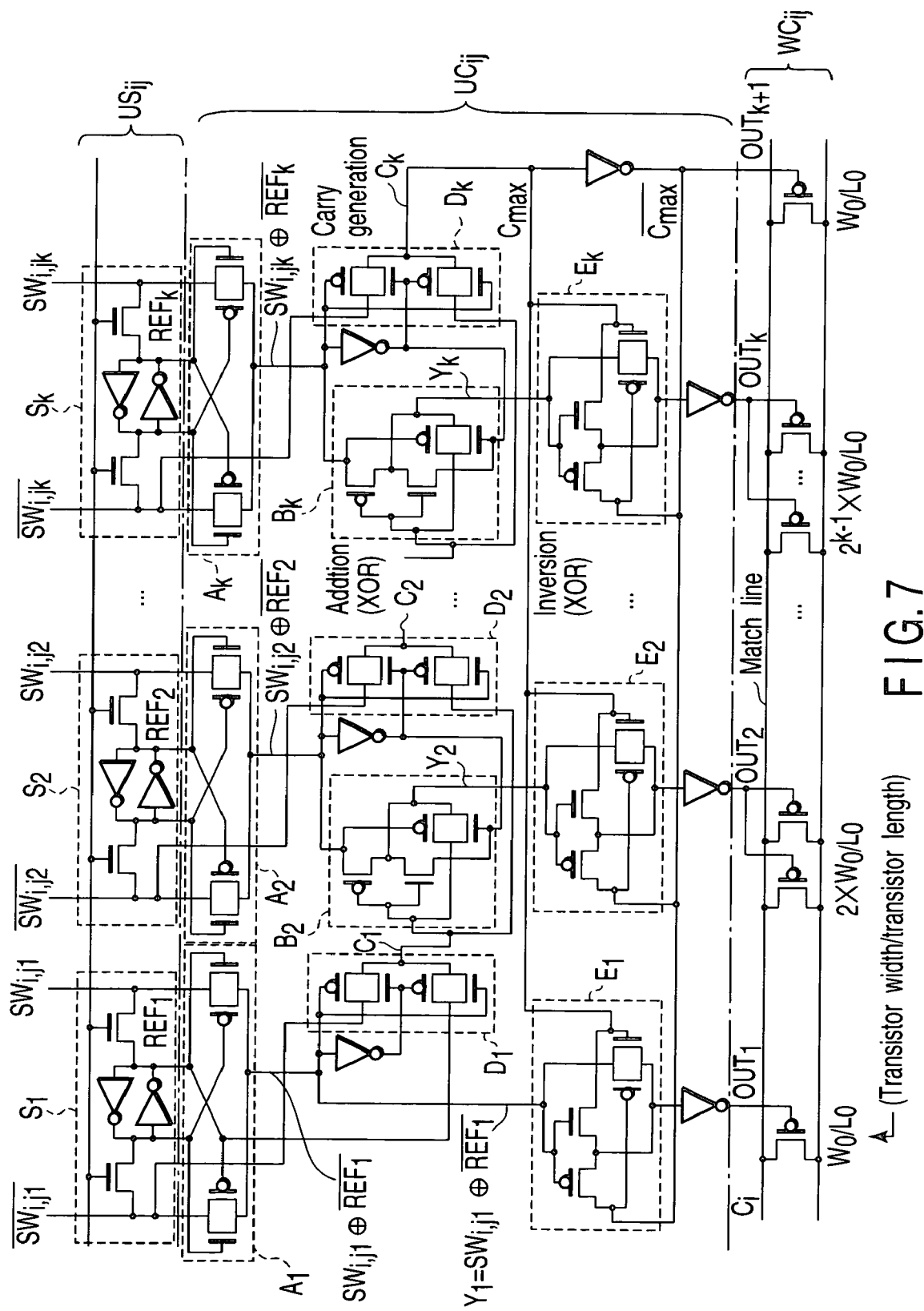
FIG. 7 is a logic circuit diagram illustrating a configuration of a Manhattan distance calculating circuit (unit comparison circuit) according to the invention.

FIG. 7 is a circuit diagram illustrating a configuration of a Manhattan distance calculating circuit of one group according to the present invention based on the above-described outline. In FIG. 7, the unit storage circuit $US_{ij}$ stores respective bit data $REF_1, REF_2, \ldots, REF_k$ of the k-bit reference data of one unit into the SRAM cells $S_1, S_2, \ldots, S_k$. The respective cell output data are transmitted to the unit comparison circuit $UC_{ij}$.

In the unit comparison circuit $UC_{ij}$, the respective cell output data $REF_1, REF_2, \ldots, REF_k$ are transmitted to XOR circuits $A_1, A_2, \ldots, A_k$ which operate an exclusive OR, and are outputted so as to be inverted/non-inverted in accordance with bit data corresponding to the respective bit data $SW_{i,j1}$, $SW_{i,j2}, \ldots, SW_{i,jk}$ (non-inversion signal and inversion signal) of the k-bit search data. Accordingly, subtraction between the bits of the search data and the reference data is realized by addition processing.

The calculating circuit at each bit is configured of portions of XOR circuits $B_2, \ldots, B_k$, carry generation circuits $D_1$, $D_2, \ldots, D_k$, and XOR circuits $E_1, E_2, \ldots, E_k$. The XOR circuits $B_2, \ldots, B_k$ carry out addition processing due to the exclusive OR of the bit output to which the unit storage circuit US corresponds and carrying data from less significant bits $C_1, C_2, \ldots, C_{k-1}$. The carry generation circuits $D_1$, $D_2, \ldots, D_k$ have a selector configuration in which carrying data to the more significant bit $C_k$ ($=C_{max}$) is generated by selecting and outputting one of the inversion bit input of the above-described search data and the carrying data from less significant bits in accordance with an operated result of the above-described XOR circuits $A_1, A_2, \ldots, A_k$. The XOR circuits $E_1, E_2, \ldots, E_k$ are for inverting the addition processed results of the respective bits when the carrying data of the most significant bit is 0. With respect to only the least significant bit (LSB), because there is no carrying from the lower digit, the XOR circuit B for addition output is not required. Further, when the carrying output $C_{max}$ of the most significant bit carry generation circuit $D_k$ is 1, a signal is added to the match line of the word weight comparison circuit $WC_i$ in order to add 1 to the calculated result. In accordance therewith, carrying processing due to +1 can be realized with a simple circuit configuration. Furthermore, in accordance with the above configuration, calculation of the absolute value of difference due to the addition processing of a complement 2's described in FIGS. 6A and 6B can be realized.

With respect to the number of transistors of the Manhattan distance calculating circuit of the invention, the circuit scale can be reduced by efficiently using the inversion signal in the memory. Further, 1 addition processing in the case of SW>REF can be realized with a simple structure. For example, in the circuit configuration of FIG. 7, it follows:

$$20 \times (k-1) + 16 + 2 = 20k - 2 \text{ (number of transistors)} \quad (5),$$

and a great reduction of about ⅖ of 50k−18 which is the number of transistors in accordance with a conventional method can be realized.

Table 2 shows the comparison of the circuit scales in a case of realizing a Manhattan distance by a Hamming distance system (refer to Document 2) and in a case of realizing a Manhattan distance directly by the present invention.

Comparisons of circuit scales in cases of being realized by a system for encoding Hamming distance and by Manhattan distance system directly Table 2A
Example of encoding of Manhattan distance by Hamming distance

| Decimal number | Binary number (3 bit) | Encoding of Manhattan distance by Hamming distance (7 bit) |
|---|---|---|
| 0 | 000 | 0000000 |
| 1 | 001 | 0000001 |
| 2 | 010 | 0000011 |
| 3 | 011 | 0000111 |
| 4 | 100 | 0001111 |
| 5 | 101 | 0011111 |
| 6 | 110 | 0111111 |
| 7 | 111 | 1111111 |

Table 2B
Distance index and circuit scale

| | System (1) Manhattan distance search is directly realized | System (2) Manhattan distance search is realized by encoding Hamming distance |
|---|---|---|
| Number of bits/binary number | $k$ | $2^k - 1$ |
| Number of transistors (SRAM) of unit storage circuit (US) | $6 \times k$ | $6 \times (2^k - 1)$ |
| Number of transistors of unit comparison circuit (UC) | $20 \times k - 2$ | $2 \times (2^k - 1)$ |
| Number of transistors of word comparison circuit (WC) | $2^k$ | $2^k - 1$ |

Table 2A shows an example of encoding of a Manhattan distance by a Hamming distance, and Table 2B shows the relationships between distance indices and circuit scales. In particular, in Table 2B, there is shown the relationship between the number of transistors and the number of bits k which are respectively required in the cases by a method (system 1) for realizing the Manhattan distance search directly by the circuit and a method (system 2) for realizing the Manhattan distance search by encoding a Hamming distance.

The cost for this mapping (encoding) is $2^k-1$ with respect to the number of bits k. Therefore, although a delay time does not affect on the reduction, a trade-off arises with respect to a magnitude of the advantage in area. Because the actual number of transistors for the subtraction per bit and the absolute value calculating circuit is 18, the number of transistors reduced at the memory region of the associative memory core by mapping can be obtained by the following conditional expression (6).

$$9(2^k-1)=\text{the number of transistors (in case of encoding: system 2)} < 24k+2^k \text{ number of transistors (in case of non-encoding: system 1)} \quad (6)$$

When mapping (encoding) is carried out with respect to the Manhattan distance search on the Hamming distance associative memory by solving Formula (6) with respect to k, it is possible make an area of the associative memory core small without increasing a minimum distance searching time up to a $k \leqq 3$ bit binary number. However, in the case of k>3 bits, a circuit area can be greatly reduced by directly realizing the Manhattan distance calculating circuit in the associative memory.

[Design of Associative Memory LSI for Searching Minimum Manhattan Distance]

Figure 8:
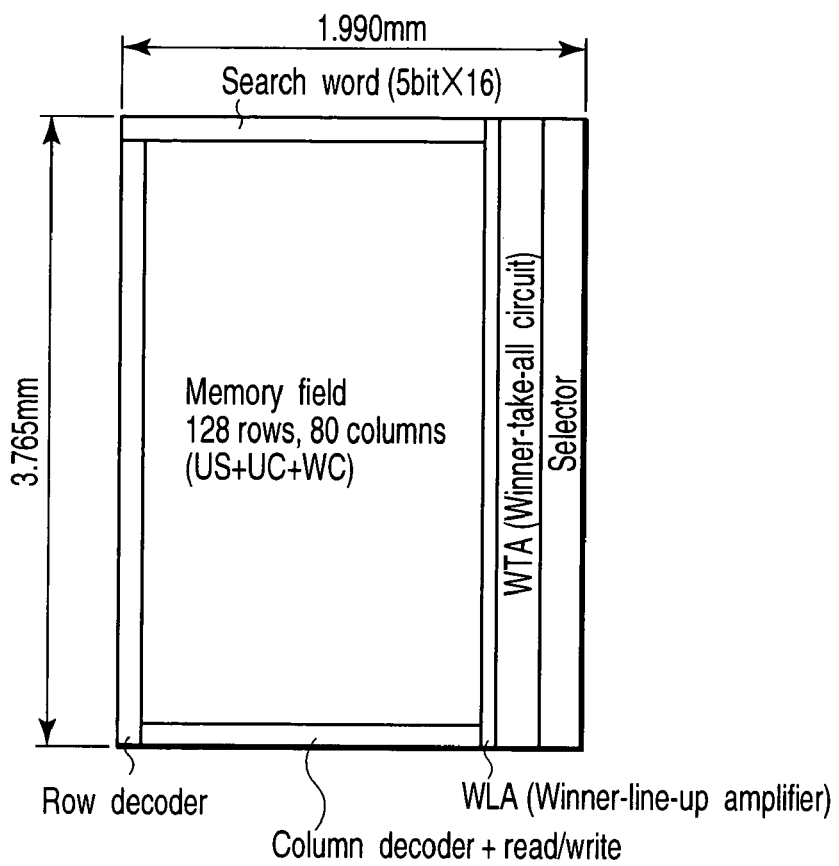
FIG. 8 is a diagram showing a layout of a minimum Manhattan distance searching associative memory designed by a 0.35 μm CMOS technology as the embodiment of the invention.
Figure 9:
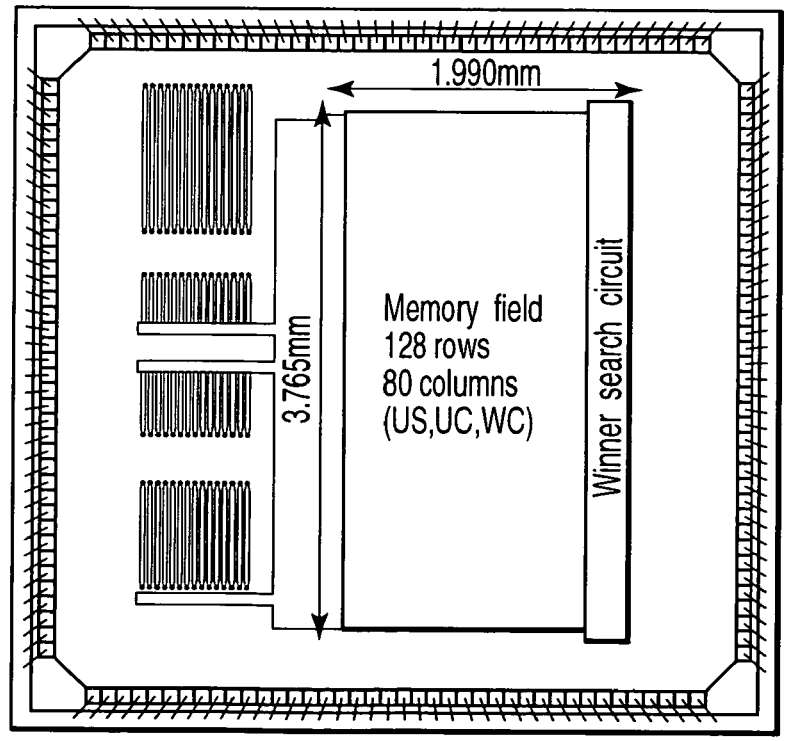
FIG. 9 is a diagram showing a chip photograph of the minimum Manhattan distance searching associative memory designed by the 0.35 μm CMOS technology as the embodiment of the invention.

5-bit minimum Manhattan distance searching associative memory according to the invention was designed by using a three-layered wiring 0.35 μm CMOS technology, an experimental manufacture of chip was carried out, and the performance thereof was evaluated. A layout of the designed 128 columns×80 rows (k=5 bits×W=16 units) of associative memory is shown in FIG. 8. In the experimentally manufactured chip, all of the circuits were realized so as to have an area of 7.49 mm² (1.990 mm×3.765 mm), and among the circuits, winner search circuits (WLA circuit and WTA circuit) could be realized by only 13.6% (1.02 mm²) of the entire body. A microphotography of the associative memory for searching the minimum Manhattan distance which was experimentally manufactured is shown in FIG. 9.

In order to evaluate the performance of the associative memory for searching the minimum Manhattan distance which was designed and experimentally manufactured, a circuit simulation using a circuit simulator HSPICE was carried out. The result of the time (winner searching time) for searching the reference data of the minimum Manhattan distance due to the HSPICE simulation is shown in FIG. 10.

Figure 10:
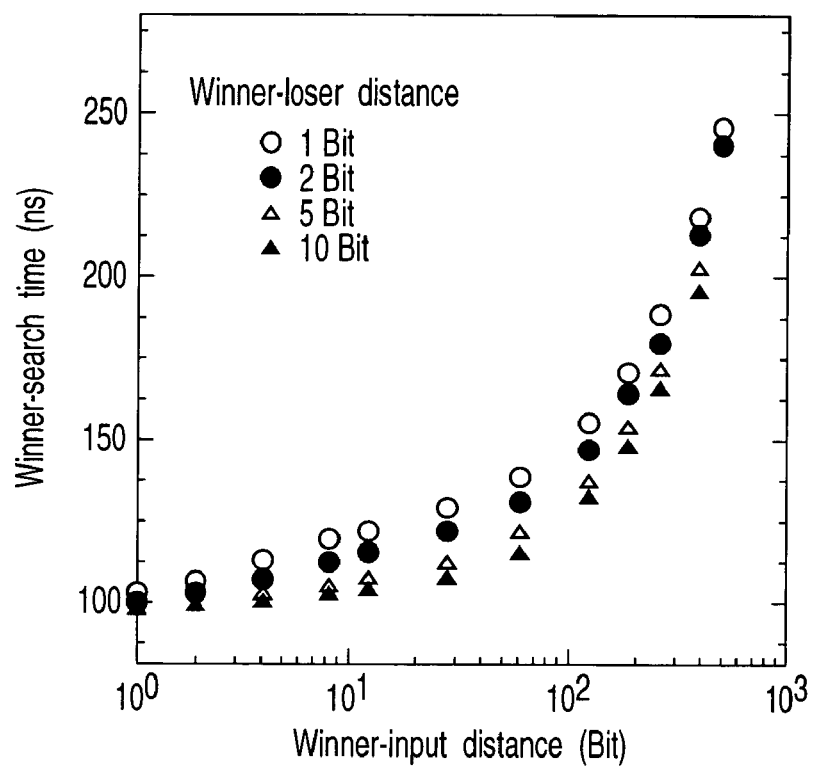
FIG. 10 is a graph showing evaluations due to a simulation of a winner searching time of the designed test chip as the embodiment of the invention.

In FIG. 10, the abscissa stands for the distance (winner-input distance (bit)) between the search data (input) and the closest reference data (winner), and the ordinate stands for the time for searching the reference data (winner-search time (ns). Further, the winner-loser distance in the graph stands for winner-search time in the cases of varying a distance between the reference data (loser) other than the closest reference data and the winner to 1 bit, 2 bits, 5 bits, and 10 bits. This simulation was executed supposing that one of the 128 reference data is a winner, and the other 127 reference data are losers with the same contents. As parameters for the simulation, the distances between the winner and the losers are set to the cases of 1 bit, 2 bits, 5 bits, and 10 bits which are difficult to search for. As the result of the simulation, the searching time was 240 nsec or less with respect to the maximum distance 496 (5-bit×16 units).

Figure 11:
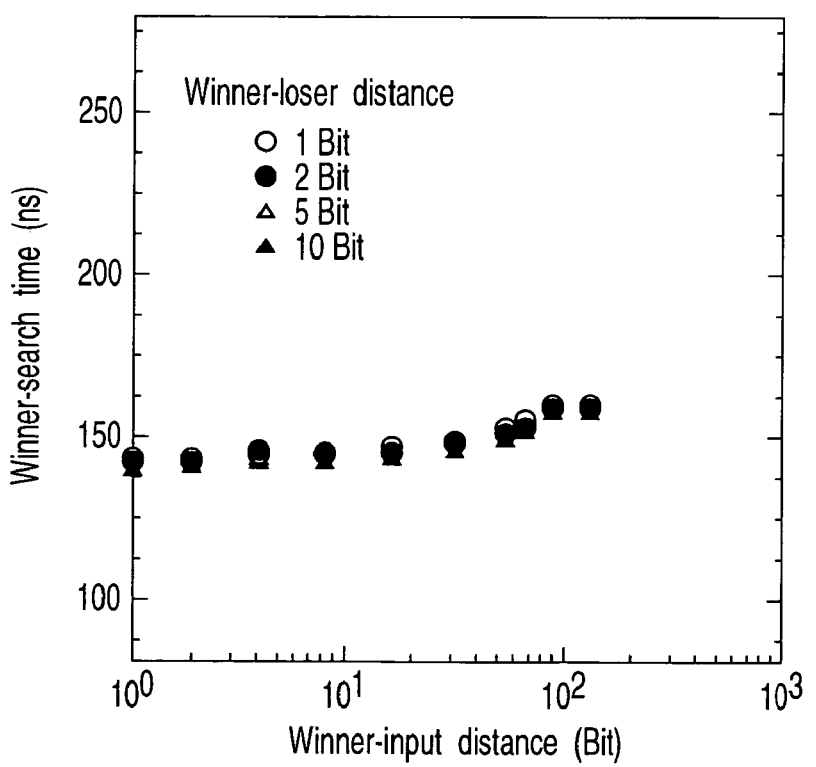
FIG. 11 is a graph showing measured results of the winner searching time of the designed test chip as the embodiment of the invention.

The measured results of the chip which was experimentally manufactured are shown in FIG. 11. From the measured results, it can be understood that the winner-input distance (distance between the reference data and the search data) could be measured up to 219 at a maximum. Further, the winner searching time was 180 nsec or less. In consideration of the fact that, in most cases, a distance difference of the winner-input distances is 50 bits or less in the actual application (for example, image compression due to the vector quantization using a code book), it is possible to search at a high-speed not more than 180 nsec. The electric power consumption was 200 mW at 5 MHz at maximum, and about 1.56 mW at 5 MHz per one reference pattern, which is an extremely low electric power consumption. A list of the performances of the minimum Manhattan distance searching associative memory which was experimentally manufactured is shown in Table 3.

TABLE 3

Data of experimentally manufactured Manhattan distance searching associative memory LSI

| Distance Measure | Manhattan-Distance |
|---|---|
| Reference-Patterns | 128 Pattern (16 binary each 5-bit long) |
| Design Area | 7.49 mm² (1.990 mm * 3.765 mm) |
| Nearest-Match-Unit Area | 1.02 mm² = 1.36% of Design Area (5.37% for WLA, 8.23% for WTA) |
| Nearest-Match Range | 0–496 ($(2^5 - 1) * 16$) (simulation), 0–219 (measured) Equivalent Bit Input-Winner Distance |
| Nearest-Match Times | <240 nsec (simulation) |
| Power Dissipation | <180 nsec (measured) |
| | <200 mW at 5 MHz (measured) |
| Technology | (<1.56 mW per Ref. Pattern) |
| | 0.35 μm, 2-Poly, 3-Metal CMOS |
| Supply Voltage | 3.3 V |

Note that the logic of the circuit shown in FIG. 7 is one example; the logic circuit may be inverted to positive logic or negative logic. For example, even if the N-MOS of the memory region is changed to P-MOS, or the P-MOS of the match line is changed to N-MOS, there is no change in the operation and effects thereof.

The associative memory apparatus according to the present invention can be used for general compression and recognition processing techniques such as an artificial intelligence system, a data bank system, an Internet router, a mobile terminal (for example, a mobile video telephone), code book base data, compression, and object recognition, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An associative memory apparatus for searching reference data REF most similar to search data SW which is input with the same unit structure, from among W×R (W and R are arbitrary natural numbers) of reference data REF which are registered in advance in a memory region and which are respectively made to be units in k-bit (k>1) units, on the basis of an index of a Manhattan distance, the apparatus comprising:

a distance calculating circuit which is formed at the memory region, and which calculates an absolute value of difference |SW-REF| in parallel with the W×R of reference data REF with respect to the search data SW, and outputs a degree D of a inconsistency between both data of the calculated results as a "Manhattan distance"; and a searching circuit which searches reference data in which the calculated result of the Manhattan distance is made to be a minimum distance, wherein the distance calculating circuit comprises W columns×R rows of unit storage circuits to store the reference data in units, W columns×R rows of unit comparison circuits which calculate a Manhattan distance between the reference data and the search data for each unit, and R rows of word weight comparison circuits which generate an electric current signal or a voltage signal corresponding to a Manhattan distance calculated at the W columns of unit comparison circuits for each row, and the unit comparison circuit compares magnitudes of the reference data REF and the search data SW, and when the compared result thereof is SW>REF, (SW+(~REF))+1 (~denotes inversion (a complement of 1): hereinafter referred to as it) is calculated, and when the compared result thereof is SW≦REF, ~(SW+(~REF)) is calculated.

2. An associative memory apparatus according to claim 1, wherein the unit comparison circuit comprises an addition circuit which calculates SW+(~REF) by expressing subtraction processing used for the calculation of the absolute value of difference by addition processing, a carrying determining circuit which determines presence/absence of a carrying of an MSB (a most significant bit) with respect to the calculated result of the addition circuit, and an output processing circuit which outputs the calculated result of the addition circuit so as to be inverted when the carrying is "absent", and which adds 1 to the calculated result of the addition circuit and outputs it when the carrying is "present".

3. An associative memory apparatus according to claim 2, wherein the addition circuit comprises a first arithmetic circuit which fetches respective bits of the search data by dual signals of a non-inversion signal and an inversion signal and operates an exclusive OR of those and bit outputs of the reference data, and a second arithmetic circuit which operates an exclusive OR of output data of the first arithmetic circuit and carrying data from a less significant bit, the carrying determining circuit comprises a selection circuit which generates carrying data by selecting one of the bit data of the search data and the carrying data from the less significant bit on the basis of the output data of the first arithmetic circuit, and the output processing circuit comprises an inversion circuit which inverts respective bit outputs of the second arithmetic circuit when it is determined that there is no carrying of the most significant bit at the carrying determining circuit, and an addition circuit which adds 1 to a sum total of the respective bit outputs of the second arithmetic circuit when it is determined that there is carrying of the most significant bit at the carrying determining circuit.

4. An associative memory apparatus according to claim 3, wherein the output processing circuit directly outputs an output of the first arithmetic circuit with respect to a least significant bit.

* * * * *